(12) United States Patent
Guo et al.

(10) Patent No.: US 9,048,092 B2
(45) Date of Patent: Jun. 2, 2015

(54) PROCESS FOR PREPARING GRAPHENE BASED ON METAL FILM-ASSISTED ANNEALING AND THE REACTION WITH $CL_2$

(75) Inventors: Hui Guo, Xi'an (CN); Keji Zhang, Xi'an (CN); Yuming Zhang, Xi'an (CN); Pengfei Deng, Xi'an (CN); Tianmin Lei, Xi'an (CN)

(73) Assignee: Xidian University (CN)

( * ) Notice: Subject to any disclaimer, the term of this patent is extended or adjusted under 35 U.S.C. 154(b) by 0 days.

(21) Appl. No.: 14/350,282

(22) PCT Filed: Sep. 3, 2012

(86) PCT No.: PCT/CN2012/080935
§ 371 (c)(1),
(2), (4) Date: Apr. 7, 2014

(87) PCT Pub. No.: WO2013/102360
PCT Pub. Date: Jul. 11, 2013

(65) Prior Publication Data
US 2014/0256120 A1 Sep. 11, 2014

(30) Foreign Application Priority Data
Jan. 3, 2012 (CN) .......................... 2012 1 0009503

(51) Int. Cl.
*H01L 21/44* (2006.01)
*H01L 21/02* (2006.01)
(Continued)

(52) U.S. Cl.
CPC .......... *H01L 21/02527* (2013.01); *C23C 16/26* (2013.01); *C01B 31/0446* (2013.01);
(Continued)

(58) Field of Classification Search
CPC ..................... H01L 21/0262; H01L 21/02381; H01L 21/02664; H01L 21/02527; H01L 21/02529; H01L 21/2807; H01L 21/28194; H01L 29/2608; H01L 29/1606
USPC ......... 438/931, 779, 680, 475, 514, 515, 502, 438/509; 257/E21.005, E21.077, E21.126, 257/E21.127, E21.128, E21.158, E21.17, 257/E21.277, E21.319
See application file for complete search history.

(56) References Cited

U.S. PATENT DOCUMENTS 7,952,088 B2 * 5/2011 Anderson et al. ............... 257/24
8,120,448 B2 * 2/2012 Peng et al. ..................... 333/186
(Continued)

FOREIGN PATENT DOCUMENTS

CN 102051677 5/2011
CN 102505113 6/2012
(Continued)

OTHER PUBLICATIONS

International Search Report for International Application No. PCT/CN2012/080935 mailed Dec. 6, 2012.

*Primary Examiner* — David Nhu
(74) *Attorney, Agent, or Firm* — Swanson & Bratschun, L.L.C.

(57) ABSTRACT

A method for preparing graphene by reaction with $Cl_2$ based on annealing with assistant metal film is provided, comprising the following steps: applying normal wash to a Si-substrate, then putting the Si-substrate into a reaction chamber of a CVD system and evacuating, rising the temperature to 950° C.-1150° C. gradually, supplying $C_3H_8$ and carbonizing the Si-substrate for 3-10 min; rising the temperature to 1150° C.-1350° C. rapidly, supplying $C_3H_8$ and $SiH_4$, growing a 3C—SiC hetero-epitaxial film on the carbonized layer, and then reducing the temperature to ambient temperature under the protection of $H_2$ gradually, introducing the grown sample wafer of 3C—SiC into a quartz tube, heating to 700-1100° C., supplying mixed gas of Ar and $Cl_2$, and reacting $Cl_2$ with 3C—SiC to generate a carbon film, applying the sample wafer of carbon film on a metal film, annealing at 900° C.-1100° C. for 10-30 min to reconstruct the carbon film into graphene; and taking out of the metal film from the sample wafer of graphene to obtain large area graphene. The graphene obtained by the method has large area, smooth surface, good continuity, and low porosity; and the product can be used to seal gas and liquid.

12 Claims, 2 Drawing Sheets

(51) Int. Cl.
    *C23C 16/26*     (2006.01)
    *C01B 31/04*     (2006.01)
    *C23C 16/02*     (2006.01)
    *C23C 16/56*     (2006.01)
    *B82Y 30/00*     (2011.01)
    *B82Y 40/00*     (2011.01)

(52) U.S. Cl.
    CPC ......... *C23C16/0218* (2013.01); *C23C 16/0272* (2013.01); *C23C 16/56* (2013.01); *H01L 21/02381* (2013.01); *H01L 21/0262* (2013.01); *H01L 21/02664* (2013.01); *B82Y 30/00* (2013.01); *B82Y 40/00* (2013.01); *C01B 2204/32* (2013.01)

(56) References Cited

U.S. PATENT DOCUMENTS

| | | | |
|---|---|---|---|
| 8,159,037 B2 * | 4/2012 | Woo et al. | 257/410 |
| 8,679,951 B2 * | 3/2014 | Shin et al. | 438/478 |
| 8,785,261 B2 * | 7/2014 | King | 438/151 |
| 2011/0086756 A1 | 4/2011 | Gao et al. | |
| 2011/0300058 A1 | 12/2011 | Strupinski | |

FOREIGN PATENT DOCUMENTS

| | | |
|---|---|---|
| CN | 102505141 | 6/2012 |
| CN | 102583329 | 7/2012 |
| CN | 102583331 | 7/2012 |
| JP | 2011230959 | 11/2011 |

* cited by examiner

PROCESS FOR PREPARING GRAPHENE BASED ON METAL FILM-ASSISTED ANNEALING AND THE REACTION WITH $CL_2$

RELATED APPLICATIONS

This application is a 35 U.S.C. §371 national phase application of PCT/CN2012/080935 (WO 2013/102360), filed on Sep. 3, 2012, entitled "Method for Preparing Graphene by Reaction with $CL_2$ Based on Annealing with Assistant Metal Film", which application claims the benefit of Chinese Patent Application Serial No. CN 201210009503.6, filed Jan. 3, 2012, which is incorporated herein by reference in its entirety.

TECHNICAL FIELD

The present invention belongs to microelectronic technology, and relates to a semiconductor film material and the preparation method thereof, particularly the present invention relates to a preparation process for graphene based on metal film assisted annealing and the reaction with $Cl_2$.

BACKGROUND TECHNOLOGY

Graphene first appeared in laboratory in the year of 2004, at that time the two scientists in the University of Manchester, i.e., Andre Jim and Kostya Novoselov, found that they could obtain a graphite flake that became thinner and thinner by a very simple method. That is, they peeled the graphite flake from the graphite, adhered the two sides of the flake onto a special tape, and after tearing the tape, the graphite flake was divided into two flakes. By continuing the above operation, the flake became thinner and thinner. Finally, they obtained a flake only consisted of one layer of carbon atom, that is, graphene. From then on, the method for preparing graphene was emerged abundantly, and currently there are mainly two preparation methods as follows:

1. Chemical vapor deposition method provides an controllable and effective method for preparing graphene, which comprises placing a planar substrate, such as metal film, metal single crystal etc. into a precursor that can decompose at high temperature, such as the atmosphere of methane, ethylene etc., the carbon atom is deposited on the surface of the substrate by high temperature annealing so as to form graphene, and finally the separate graphene flake can be obtained after removing the metal substrate by chemical etching. The growth of the graphene such as the growth rate, the thickness, the area etc. can be adjusted by selecting parameters such as the type of the substrate, the growing temperature, the flow rate of the precursor etc. However, the biggest disadvantage of this method consists in that because of the strong interaction of the obtained graphene flake with the substrate, many properties of the single layer of graphene are lost and the continuity of the graphene is not good.

2. SiC thermal decomposing method. In this method, the single crystal SiC is heated so as to remove Si by decomposing the SiC on the surface, and the remaining carbon forms graphene. However, the single crystal SiC used in the SiC thermal decomposition is very expensive and the grown graphene is distributed in a shape of island, the layer is not uniform and the size is small. Thus, it is difficult to prepare graphene with a large area by this method.

SUMMARY OF THE INVENTION

In view of the above problems in the prior art, an object of the present invention is to provide a process for preparing graphene based on metal film-assisted annealing and the reaction with $Cl_2$ so as to improve the smoothness of the surface and continuity, decrease the porosity, lower the cost, and achieve the preparation of graphene with a large area on 3C—SiC substrate.

For achieving the above objects, the process of the present invention for preparing graphene comprises the following steps:

(1) a Si substrate is subjected to standard cleaning, (2) the cleaned Si substrate is placed into a CVD system reactor and the reactor is vacuumized, the temperature is gradually raised to a carbonization temperature of 950-1150° C. under the protection of $H_2$, and $C_3H_8$ is flowed into the reactor, the Si substrate is carbonized for 3-10 min so as to grow a carbonization layer, (3) the temperature is rapidly raised to 1150-1350° C., $C_3H_8$ and $SiH_4$ are flowed into the reactor, 3C—SiC heterogeneous epitaxial film is grown on the obtained carbonization layer for 30-60 min, and then the temperature is gradually decreased to the ambient temperature under the protection of $H_2$ so as to complete the growth of the 3C—SiC epitaxial film, (4) the grown 3C—SiC sample is placed into a quartz tube, and heated to 700-1100° C., a mixed gas of Ar and $Cl_2$ is flowed into the quartz tube, and $Cl_2$ is reacted with 3C—SiC to obtain a carbon film, (5) the obtained carbon film sample is placed onto a metal film that has catalysis for the reconfiguration of carbon to graphene, and then they are annealed together for 10-30 min under the temperature of 900-1100° C. in Ar atmosphere, the carbon film is reconfigured to graphene, and (6) the metal film is removed from the graphene sample so as to obtain graphene with a large area.

Another object of the present invention is to provide graphene prepared by the above process that has superior properties and has a large area.

Compared with prior art, the present invention has the following advantages:

1. Due to a carbonization layer previously grown on the Si substrate as a transition layer and then 3C—SiC is epitaxially grown during the process of the present invention, the grown 3C—SiC has a high quality.

2. Since 3C—SiC film can heterogeneous epitaxially grown on the Si substrate and the Si substrate wafer has a maximum size of 20 inch, graphene with a large area can be grown by said process with a cheap price.

3. The reaction of 3C—SiC with $Cl_2$ in the present invention can be carried out at a lower temperature and normal pressure with a rapid reaction rate, so the energy can be saved.

4. Contributed by the reaction of 3C—SiC with $Cl_2$ in the present invention, the obtained carbon film has a smooth surface and a low porosity, in addition, the thickness of the film can be easily controlled, and graphene obtained by said carbon film can be used to seal gas and liquid.

5. Due to the annealing on the metal film, the obtained carbon film can be easily reconfigured to form graphene with a good continuity.

EMBODIMENT

Figure 1:
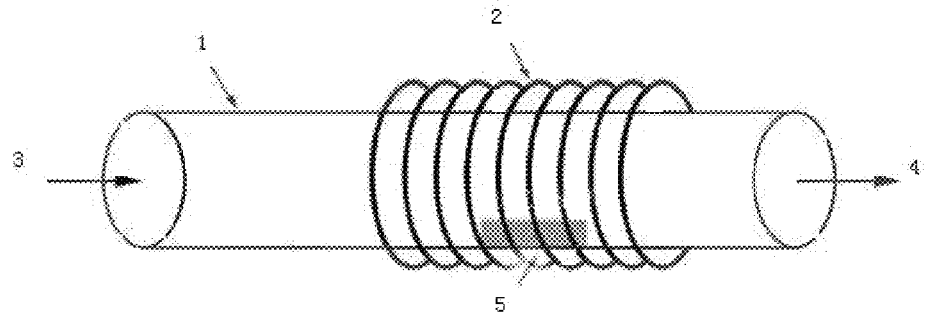
FIG. 1 is a schematic drawing of the device used when preparing graphene with a large area from the reaction of 3C—SiC sample with $Cl_2$ gas in the present invention.

As shown in FIG. 1, in the process for preparing graphene in the present invention, the device used for the reaction of 3C—SiC sample with $Cl_2$ gas mainly consists of quartz tube 1 and resistance furnace 2, wherein the quartz tube 1 is equipped with inlet 3 and outlet 4, and the resistance furnace 2 is annular hollow structure with the quartz tube 1 inserted therein, and 3C—SiC sample 5 is placed into the quartz tube 1.

Figure 2:
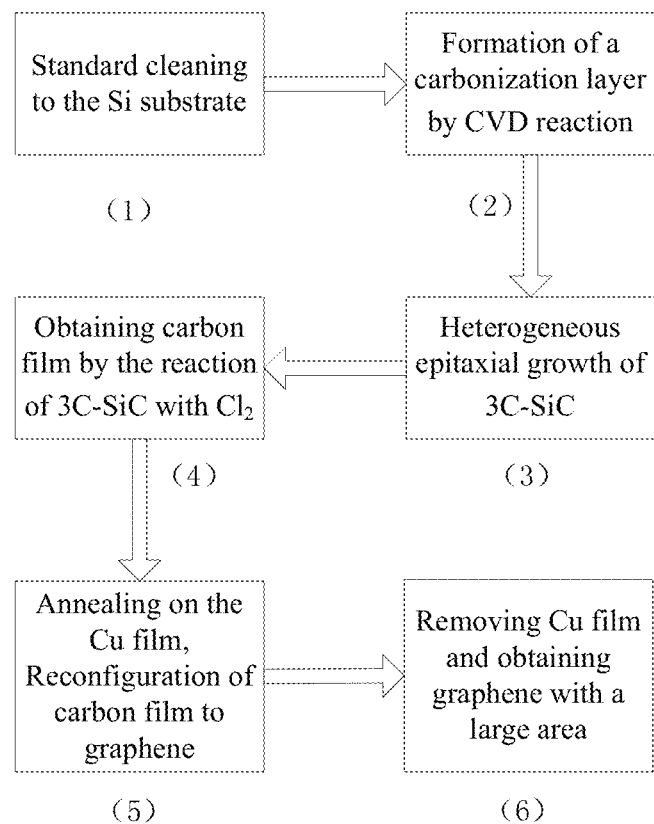
FIG. 2 is a flowing chart showing the preparation process of graphene in the present invention.

In the following, the preparation process for graphene based on metal film-assisted annealing and the reaction with $Cl_2$ will be illustrated in detail referring to FIG. 2.

The preparation process of the present invention comprises the following steps:

Step (1): firstly, a 2-20 inch Si substrate is cleaned in a standard way. The purpose of the substrate in the present invention is to epitaxially grow SiC thereon, for this purpose, Si substrate or SiC single crystal substrate can be used for the epitaxial grow of SiC, however, the size of the Si substrate is larger than that of SiC single crystal, therefore in order to obtain graphene with a large area, Si substrate is preferred to the heterogeneous epitaxially grow of SiC. The Si substrate can be of 2-20 inch, and a Si wafer of 4-12 inch is usually used, which thus can grow graphene with a large area (4-12 inch). For removing the surface contaminant on the Si substrate, ammonium hydroxide-hydrogen peroxide solution ($NH_4OH+H_2O_2$) and hydrochloric acid-hydrogen peroxide solution ($HCl+H_2O_2$) can be respectively used to remove the organic residue and ionic contaminant on the Si substrate.

Step (2): the cleaned Si substrate is placed into a CVD system reactor, and the reactor is vacuumized, the temperature is gradually raised to a carbonization temperature of 950-1150° C. under the protection of $H_2$, and $C_3H_8$ is flowed into the reactor, the Si substrate is carbonized for 3-10 min so as to grow a carbonization layer.

In this step, the lower carbonization temperature would result in an inferior crystal quality of the film, and the reason is that the decomposition of $C_3H_8$ at low temperature is insufficient, and the Si atom in the substrate do not have enough energy to diffuse to bond with the C atom on the surface to form a C—Si bond, which caused an inferior crystal quality of the carbonized layer. However, when the carbonization temperature is too high, the carbonization is too severe, which likewise would cause an inferior crystal quality of the carbonized layer. So, the carbonization temperature is set as 950-1150° C. It is preferred that the carbonization temperature is 1000° C., at which the prepared 3C—SiC film has a better orientation, and the plane (111) of 3C—SiC is parallel with the plane (111) of the Si substrate, so as to obtain a high crystal quality of the film.

On the other hand, if the period for carbonization is too short, there will be no enough time for the surface of the Si substrate to carbonize sufficiently, and the carbonization is not uniform enough, the crystallization degree of the carbonized layer is low. With the period for the carbonization being longer, the carbonization for the substrate is sufficient, and the crystallization degree can be raised. However, with a too long carbonization period, the carbonization layer previously formed would weaken the diffusion of the Si atom in the substrate, and thus the Si atom cannot diffuse to the surface of the carbonization layer to react with the C atom. In this situation, the carbonization would be "too much", and deteriorate the crystal quality of the carbonization layer. If the period for carbonization is more than 7 min, the crystal quality is lowered, and if the period for carbonization is more than 10 min, the crystal quality is worse. Thus, the period for carbonization is set as 3-10 min, preferably, 4-7 min, and when the period for carbonization is 5 min, the crystal quality of the sample is the best and it is most preferred.

In addition, the growth of 3C—SiC needs a high vacuum, and if the vacuum degree is low, the quality of 3C—SiC crystal would be decreased. Thus, the vacuum degree in the reactor is preferable up to $10^{-7}$ mbar level.

The flow rate of $C_3H_8$ does not have a big impact on the carbonization and there is no specific restriction. However, a lower flow rate would render a lower reaction rate, and a higher flow rate would also influence the crystal quality of the film. So, it is preferred that the flow rate of $C_3H_8$ is set as 30-40 sccm.

Step (3): Then, the temperature is rapidly raised to 1150-1350° C., $C_3H_8$ and $SiH_4$ are flowed into the reactor, 3C—SiC heterogeneous epitaxial film is grown on the obtained carbonization layer for 30-60 min, and then the temperature is gradually decreased to the ambient temperature under the protection of $H_2$ so as to complete the growth of the 3C—SiC epitaxial film.

In this step, the growing temperature of the film is the main factor that influences the quality of 3C—SiC film, when the growing temperature is lower than 1150° C., C atom and Si atom are absorbed on the surface of the substrate, and cannot obtain enough kinetic energy on the horizontal direction, and cannot move to the corresponding lattice position to promote the growth of the epitaxial film, so the crystal quality of the epitaxial layer is low. While, when the growing temperature is too high, the atom would have enough kinetic energy to enter into lattice, and is easily accumulated to form large particles and holes, which would also lower the crystal quality of the epitaxial layer. Thus, it is necessary to set the growing temperature of the film as 1150-1350° C. When the growing temperature is raised to 1170-1200° C., a single oriented 3C—SiC film can be obtained, and thus is preferred.

The growing period for the film also has a big impact on the quality of 3C—SiC film, and when the growing period is not less than 30 min, a single crystal 3C—SiC film can be obtained, while when the growing period is more than 1 h, graphite phase may appear in the film. Thus, the growing period of the film is set as 30-60 min.

During the growth of 3C—SiC heterogeneous epitaxial film, different flow rate for propane and silane would change the concentration of the reacted C atom and Si atom. That is, the carbon/silicon ratio will influence the quality of 3C—SiC heterogeneous epitaxial layer. With a too high or too low carbon/silicon ratio, the growth will occur in a "carbon-rich" or "silicon-rich" environment, which will influence the formation of C—Si bond during the reaction, and further influence the crystal quality of the epitaxial layer. Therefore, it is preferred that the flow rate of said $SiH_4$ and said $C_3H_8$ is respectively set in a range of 15-25 sccm and 30-50 sccm. It is more preferred that the carbon/silicon ratio is set as 6(C/Si=6), for example, the flow rate of silane is 20 ml/min and the flow rate of propane is 40 ml/min and then the quality of growing crystal is superior.

Step (4): The grown 3C—SiC sample is placed into a quartz tube, and heated to 700-1100° C., a mixed gas of Ar and $Cl_2$ is flowed into the quartz tube, and $Cl_2$ is reacted with 3C—SiC to obtain a carbon film.

When the heating temperature is lower than 700° C., the reaction rate is slow, and the skin layer of SiC has not been completely converted to carbon, or it can be said that the thickness of the resulting carbon film is too thin. When the heating temperature is in the range of 700-1100° C., the reaction rate is fast, and the thickness of the carbon film is increased with the increasing heating temperature. If the temperature is above 1100° C., a belt shape graphite is created, and the pore size is increased, the reaction rate at this time is mainly dominated by kinetic factors. So, the heating temperature is set as 700-1100° C., preferably 800-1000° C.

When the duration time of the reaction is too short, such as less than 3 min, only a small amount of carbon film is prepared, the longer the time, the thicker the resulting carbon film. The reaction time can be controlled according to the desired thickness of the obtained carbon film. The reaction time is preferably 3-15 min.

In the above step (4), the flow rate of said Ar gas and said $Cl_2$ gas, is respectively preferable set as 95-98 sccm and 2-5 sccm. By defining the flow rate of $Cl_2$ gas in this range, the chlorination rate can be better controlled, which cannon be too fast, and a too fast rate would result in too much carbon, which is not favorable for the formation of graphene film.

In the present invention, 3C—SiC can be reacted with $Cl_2$ at a low temperature and under normal pressure according to the following formula, and the reaction rate is fast, and thus energy can be greatly saved.

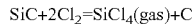

$$SiC + 2Cl_2 = SiCl_4(gas) + C$$

Since the thermodynamic stability of $SiCl_4$ at a high temperature greatly exceeds that of $CCl_4$, so $Cl_2$ gas has a priority to react with Si in SiC so as to obtain $SiCl_4$. The resulting $SiCl_4$ is discharged from the reaction system in a form of gas.

By utilizing the reaction of 3C—SiC with $Cl_2$ gas, the carbon film obtained in the present invention has a smooth surface and a low porosity, and the thickness thereof is easy to be controlled.

Step (5): A metal film with a thickness of 250-300 nm is prepared beforehand, and the above obtained carbon film sample is placed on the metal film and then they are annealed together for 10-30 min at a temperature of 900-1100° C. in Ar atmosphere, the carbon film is reconfigured to graphene.

The metal film can be arbitrarily selected as long as it has catalysis effect on the reconfiguration of the carbon film to graphene, such as Ni film and Cu film etc. can be used. From the viewpoint of generalization, the stability of the resulting graphene, Cu film is preferred. Due to that Cu is not oxidized when stores in air etc., there is no need to specifically prepare a Cu film, and any existing Cu film can be used. There is no specific requirement on the thickness of the Cu film, preferably 250-300 nm.

During the annealing, an annealing temperature of 900-1100° C. is appropriate when the carbon film reconfigures to graphene, if the temperature is too low, there is no enough energy provided for the reconfiguration of the carbon film, while if the temperature is too high, the reconfiguration is not uniform, accompanied with many resulting defects. The annealing time is preferably 10-30 min, if the annealing time is too short, the porosity of the graphene is high, and the quality thereof is not good, with a longer annealing time, the porosity of the graphene is decreased, and the surface thereof is much smooth. However, if the time is too much longer, new defects would be resulted, and the quality of the graphene would decrease.

In addition, there is no restriction to the flow rate of Ar gas at the time of annealing, which is determined based on the size of the annealing chamber and the size of the substrate, and is preferably 25-100 sccm. The sample undergoes a heat treatment under the protection of Ar gas, thus the absorbed chlorine gas can be desorbed from the sample and the meal film can be protected.

Step (6): The metal film is removed from the graphene sample so as to obtain graphene.

Due to a carbonization layer previously grown on the Si substrate as a transition layer and then 3C—SiC is epitaxially grown, the grown 3C—SiC has a high quality. Further, since 3C—SiC film can heterogeneous epitaxially grown on the Si substrate and the Si substrate wafer has a maximum size of 20 inch, graphene with a large area can be grown by said process and the price is cheap. In addition, the reaction of 3C—SiC with $Cl_2$ can be carried out at a low temperature and under normal pressure with a rapid reaction rate, so the energy can be saved. Further, contributed by the reaction of 3C—SiC with $Cl_2$ gas, the obtained carbon film has a smooth surface and a low porosity, in addition, the thickness of the film can be easily controlled and the graphene obtained from said carbon film can be used to seal gas and liquid. Since the annealing is carried out on the metal film in the present invention, the resulting carbon film can easily be reconfigured to form graphene with a good continuity.

Figure 3:
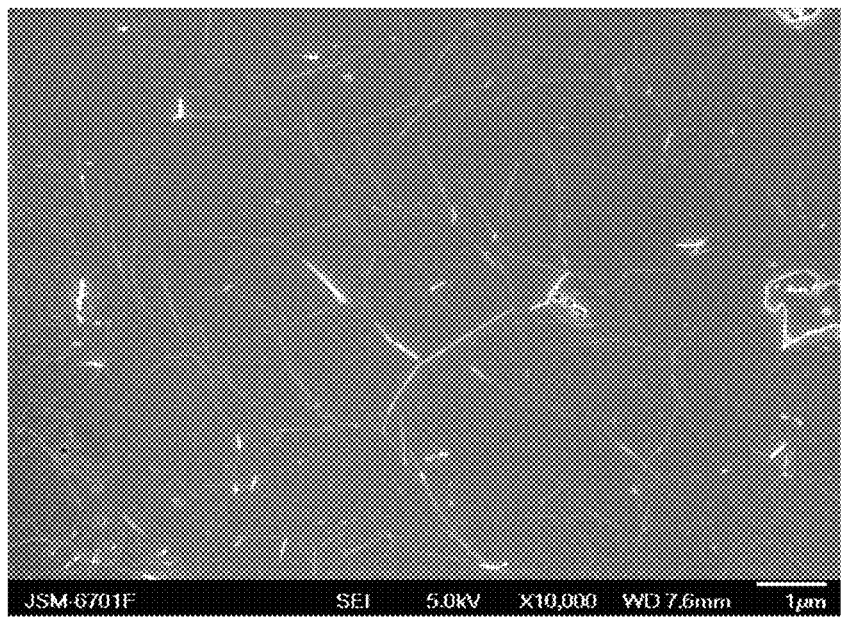
FIG. 3 is a SEM photography of the graphene of the present invention.

FIG. 3 shows SEM photography of the inventive graphene prepared according to the process of the present invention. It can be seen that the graphene of the present invention has a large area, a smooth surface, a low porosity and a dense film surface.

Below, three examples are provided for the preparation process for the graphene of the present invention. It needs to be noted that the examples are only illustrative for the present preparation process, and the specific conditions disclosed therein do not make any restriction to the scope of the present invention.

Example 1

Step 1: The contaminant on the sample surface was removed

A Si substrate of 4 inch was subjected to a surface cleaning, that is, the sample was soaked for 10 min by using the reagent $NH_4OH+H_2O_2$, then taken out and dried to remove the organic residue on the sample surface, and then the reagent $HCl+H_2O_2$ was used to soak the sample for 10 min, then taken out and dried to remove the ionic contaminant.

Step 2: The Si substrate was placed into a CVD system reactor and the reactor was vacuumized to a $10^{-7}$ mbar level.

Step 3: A carbonization layer was grown

The temperature of the reactor was raised to a carbonization temperature of 1000° C. under the protection of $H_2$, and $C_3H_8$ was flowed into the reactor with a flow rate of 40 sccm, a carbonization layer was grown on the Si substrate for 8 min.

Step 4: 3C—SiC epitaxial film was grown on the carbonization layer

The temperature of the reactor was rapidly raised to a growing temperature of 1150° C., $SiH_4$ and $C_3H_8$ were flowed into respectively with a flow rate of 15 sccm and 30 sccm so as to carry out the growing of 3C—SiC heterogeneous epitaxial film for 60 min, and then the temperature was gradually decreased to the ambient temperature under the protection of $H_2$ so as to complete the growth of the 3C—SiC epitaxial film.

Step 5: The 3C—SiC sample was placed into a quartz tube, and air discharging and heating were performed.

(5.1) The grown 3C—SiC epitaxial film sample 5 was taken out from the CVD system reactor and placed into the quartz tube 1, and the quartz tube 1 was placed into the resistance furnace 2;

(5.2) Ar gas with a flow rate of 80 sccm was flowed into the quartz tube from the inlet 3, and the quartz tube was evacuated for 10 min and the air was discharged from the outlet 4;

(5.3) the resistance furnace was switched on and the temperature was raised to 700° C. so as to make the quartz tube therein be heated to 700° C.

Step 6: A carbon film was grown

Ar gas and $Cl_2$ gas were flowed into the quartz tube respectively with a flow rate of 98 sccm and 2 sccm, and the time was 4 min $Cl_2$ was reacted with 3C—SiC to obtain a carbon film.

Step 7: Graphene was created by reconfiguration (7.1) The obtained carbon film sample was taken out from the quartz tube and placed on a metal film with a thickness of 250 nm;

(7.2) The carbon film sample and the metal film were integrally placed into a Ar gas atmosphere with a flow rate of 100 sccm, annealed for 30 min at a temperature of 900° C., the carbon film was reconfigured to a continuous graphene under the catalysis of the metal Cu;

(7.3) The metal film was removed from the graphene sample so as to obtain graphene with a large area (the size can be up to 4 inch).

Example 2

Step 1: The contaminant on the sample surface was removed

A Si substrate of 8 inch was subjected to a surface cleaning, that is, the sample was soaked for 10 min by using the reagent $NH_4OH+H_2O_2$, then taken out and dried to remove the organic residue on the sample surface, and then the reagent $HCl+H_2O_2$ was used to soak the sample for 10 min, then taken out and dried to remove the ionic contaminant.

Step 2: The Si substrate was placed into a CVD system reactor and the reactor was vacuumized to a $10^{-7}$ mbar level.

Step 3: A carbonization layer was grown

The temperature of the reactor was raised to a carbonization temperature of 1050° C. under the protection of $H_2$, and $C_3H_8$ was flowed into the reactor with a flow rate of 40 sccm, a carbonization layer was grown on the Si substrate for 5 min.

Step 4: 3C—SiC epitaxial film was grown on the carbonization layer

The temperature of the reactor was rapidly raised to a growing temperature of 1200° C., $SiH_4$ and $C_3H_8$ were flowed into respectively with a flow rate of 20 sccm and 40 sccm so as to carry out the growing of 3C—SiC heterogeneous epitaxial film for 45 min, and then the temperature was gradually decreased to the ambient temperature under the protection of $H_2$ so as to complete the growth of the 3C—SiC epitaxial film.

Step 5: The 3C—SiC sample was placed into a quartz tube, and air discharging and heating were performed.

The grown 3C—SiC epitaxial film sample 5 was taken out from the CVD system reactor and placed into the quartz tube 1, and the quartz tube 1 was placed into the resistance furnace 2; Ar gas with a flow rate of 80 sccm was flowed into the quartz tube from the inlet 3, and the quartz tube was evacuated for 10 min and the air was discharged from the outlet 4; the resistance furnace was switched on and the temperature was raised to 1000° C., so as to make the quartz tube therein to be heated to 1000° C.

Step 6: The carbon film was grown

Ar gas and $Cl_2$ gas were flowed into the quartz tube respectively with a flow rate of 97 sccm and 3 sccm, and the time was 5 min. $Cl_2$ was reacted with 3C—SiC to obtain a carbon film.

Step 7: Graphene was created by reconfiguration

The obtained carbon film sample was taken out from the quartz tube and placed on a metal film with a thickness of 280 nm; the carbon film sample and the metal film were integrally placed into a Ar atmosphere with a flow rate of 75 sccm, annealed for 15 min at a temperature of 1050° C., the carbon film was reconfigured to a continuous graphene under the catalysis of the metal Cu; the metal film was removed from the graphene sample so as to obtain graphene with a large area (the size can be up to 8 inch).

Example 3

Step A: A Si substrate of 12 inch was subjected to a surface cleaning, that is, the sample was soaked for 10 min by using the reagent $NH_4OH+H_2O_2$, then taken out and dried to remove the organic residue on the sample surface, and then the reagent $HCl+H_2O_2$ was used to soak the sample for 10 min, then taken out and dried to remove the ionic contaminant.

Step B: the Si substrate was placed into a CVD system reactor and the reactor was vacuumized to a $10^{-7}$ mbar level.

Step C: The temperature of the reactor was raised to a carbonization temperature of 1150° C. under the protection of $H_2$, and $C_3H_8$ was flowed into the reactor with a flow rate of 40 sccm for 4 min, a carbonization layer was grown on the Si substrate.

Step D: The temperature of the reactor was rapidly raised to a growing temperature of 1350° C., $SiH_4$ and $C_3H_8$ were flowed into respectively with a flow rate of 25 sccm and 50 sccm so as to carry out the growing of 3C—SiC heterogeneous epitaxial film for 36 min, and then the temperature was gradually decreased to the ambient temperature under the protection of $H_2$.

Step E: The grown 3C—SiC epitaxial film sample 5 was taken out from the CVD system reactor and placed into the quartz tube 1, and the quartz tube 1 was placed into the resistance furnace 2; Ar gas with a flow rate of 80 sccm was flowed into the quartz tube from the inlet 3, and the quartz tube was evacuated for 10 min and the air was discharged from the outlet 4; the resistance furnace was switched on and the temperature was raised to 1100° C., so as to make the quartz tube therein to be heated to 1100° C.

Step F: Ar gas and $Cl_2$ gas were flowed into the quartz tube respectively with a flow rate of 95 sccm and 5 sccm, and the time was 4 min. $Cl_2$ was reacted with 3C—SiC to obtain a carbon film.

Step G: The obtained carbon film sample was taken out from the quartz tube and placed on a metal film with a thickness of 300 nm; the carbon film sample and the metal film were integrally placed into a Ar gas atmosphere with a flow rate of 25 sccm, annealed for 10 min at a temperature of 1100° C., the carbon film was reconfigured to a continuous graphene under the catalysis of the metal Cu; the metal film was removed from the graphene sample so as to obtain graphene with a large area (the size can be up to 12 inch).

By the preparation process of the present invention, graphene with a large area can be obtained, and its surface is smooth, continuous, with a low porosity, and can be used to seal gas and liquid. In addition, the graphene prepared by the present invention can be rolled to cylinder to use as a carbon nanotube, for hydrogen storage, and it can be used to prepare high speed graphene transistor and transparent conductive film.

What is claimed is:

1. A process for preparing graphene based on metal film-assisted annealing and a reaction with $Cl_2$, characterized in that said process comprises the following steps:
   (1) cleaning a Si substrate;
   (2) placing the cleaned Si substrate into a CVD system reactor, wherein the reactor is vacuumized, the temperature is gradually raised to a carbonization temperature of 950° C.-1150° C. under a protection of $H_2$, and $C_3H_8$ is flowed into the reactor, such that the Si substrate is carbonized for 3-10 min so as to grow a carbonization layer;

(3) raising the temperature to 1150° C.-1350° C. while $C_3H_8$ and $SiH_4$ are flowed into the reactor, and a 3C—SiC heterogeneous epitaxial film is grown on the carbonization layer for 30-60 minutes, and then the temperature is gradually decreased to an ambient temperature under the protection of $H_2$ so as to complete the growth of the 3C—SiC epitaxial film, (4) placing the 3C—SiC film into a quartz tube, and heating the 3C—SiC film to 700° C.-1100° C. as a mixed gas of Ar and $Cl_2$ is flowed into the quartz tube, and $Cl_2$ is reacted with the 3C—SiC film to obtain a carbon film, (5) placing the carbon film onto a metal film that has catalysis for a reconfiguration of carbon to graphene, and annealing the carbon film and the metal film together for 10-30 minutes under a temperature of 900° C.-1100° C. in an Ar atmosphere, wherein the carbon film is reconfigured to graphene, and (6) removing the metal film from the graphene sample so as to obtain graphene with a large area.

2. The process for preparing graphene according to claim 1, characterized in that in step (2), the vacuum in the reactor is about $10^{-7}$ mbar.

3. The process for preparing graphene according to claim 1, characterized in that in step (2), the flow rate of $C_3H_8$ is 30 sccm-40 sccm.

4. The process for preparing graphene according to claim 1, characterized in that in step (3), the flow rate of the flowed $SiH_4$ and $C_3H_8$ is respectively 15 sccm-25 sccm and 30 sccm-50 sccm.

5. The process for preparing graphene according to claim 4, characterized in that the flow rates of $SiH_4$ and of $C_3H_8$ are adjusted such that the ratio of C/Si=6.

6. The process for preparing graphene according to claim 1, characterized in that in step (4), the flow rate of the flowed Ar and $Cl_2$ is respectively 95 sccm-98 sccm and 2 sccm-5 sccm.

7. The process for preparing graphene according to claim 1, characterized in that in step (5), the flow rate of Ar when annealing is 25 sccm-100 sccm.

8. The process for preparing graphene according to claim 1, characterized in that in step (5), the metal film is a Cu film.

9. The process for preparing graphene according to claim 8, characterized in that the Cu film has a thickness of 250 nm-300 nm.

10. The process for preparing graphene according to claim 1, characterized in that a dimension of the Si substrate is 2 inches-20 inches.

11. The process for preparing graphene according to claim 1, characterized in that a dimension of the graphene sample is 2 inches-12 inches.

12. A graphene sample with a large area obtained by a process comprising the following steps:

(1) cleaning a Si substrate;

(2) placing the cleaned Si substrate into a CVD system reactor, wherein the reactor is vacuumized, the temperature is gradually raised to a carbonization temperature of 950° C.-1150° C. under a protection of $H_2$, and $C_3H_8$ is flowed into the reactor, such that the Si substrate is carbonized for 3-10 min so as to grow a carbonization layer;

(3) raising the temperature to 1150° C.-1350° C. while $C_3H_8$ and $SiH_4$ are flowed into the reactor, and a 3C—SiC heterogeneous epitaxial film is grown on the carbonization layer for 30-60 minutes, and then the temperature is gradually decreased to an ambient temperature under the protection of $H_2$ so as to complete the growth of the 3C—SiC epitaxial film, (4) placing the 3C—SiC film into a quartz tube, and heating the 3C—SiC film to 700° C.-1100° C. as a mixed gas of Ar and $Cl_2$ is flowed into the quartz tube, and $Cl_2$ is reacted with the 3C—SiC film to obtain a carbon film, (5) placing the carbon film onto a metal film that has catalysis for a reconfiguration of carbon to graphene, and annealing the carbon film and the metal film together for 10-30 minutes under a temperature of 900° C.-1100° C. in an Ar atmosphere, wherein the carbon film is reconfigured to graphene sample, and (6) removing the metal film from the graphene sample so as to obtain graphene with a large area.

* * * * *